United States Patent
Teraguchi

(10) Patent No.: US 8,878,203 B2
(45) Date of Patent: Nov. 4, 2014

(54) SWITCHING CIRCUIT

(71) Applicant: Kabushiki Kaisha Toshiba, Tokyo (JP)

(72) Inventor: Takayuki Teraguchi, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/787,744

(22) Filed: Mar. 6, 2013

(65) Prior Publication Data
US 2013/0313644 A1 Nov. 28, 2013

(30) Foreign Application Priority Data
May 28, 2012 (JP) ................................. 2012-120822

(51) Int. Cl.
| H01L 33/00 | (2010.01) |
| H01L 27/15 | (2006.01) |
| H01L 27/12 | (2006.01) |
| H01L 27/06 | (2006.01) |
| H01L 27/02 | (2006.01) |

(52) U.S. Cl.
CPC .......... *H01L 27/124* (2013.01); *H01L 27/1203* (2013.01); *H01L 27/0688* (2013.01); *H01L 27/0207* (2013.01)
USPC ....... 257/88; 257/211; 257/758; 257/E23.145

(58) Field of Classification Search
CPC .............. H01L 27/124; H01L 27/1203; H01L 27/0688
USPC .............. 438/34, 129, 599, 622; 257/88, 211, 257/758, E23.145
See application file for complete search history.

(56) References Cited

U.S. PATENT DOCUMENTS

| 5,917,224 | A * | 6/1999 | Zangara ........................ 257/211 |
| 6,022,797 | A * | 2/2000 | Ogasawara et al. ........... 438/622 |
| 6,057,897 | A * | 5/2000 | Ichikawa et al. ................ 257/59 |
| 6,355,550 | B1 * | 3/2002 | Parris et al. ................... 438/622 |
| 8,170,500 | B2 | 5/2012 | Seshita | |
| 2001/0045670 | A1 * | 11/2001 | Nojiri ........................... 257/786 |

(Continued)

FOREIGN PATENT DOCUMENTS

| JP | 2008-503892 | 2/2008 |
| JP | 2008-246659 | 10/2008 |

(Continued)

OTHER PUBLICATIONS

Hyeokjae Lee, et al.; Harmonic Distortion due to Narrow Width Effects in Deep sub-micron SOI-CMOS Device for analog-RF Applications, 2002 IEEE International SOI Conference, Oct. 2002; pp. 83-85.

Yuuichi Hirano, et al.; Impact of Actively Body-bias Controlled (ABC) SOI SRAM by Using Direct Body Contact Technology for Low-Voltage Application; IEEE IEDM 2003; pp. 03-35-03-38.

*Primary Examiner* — Mary Wilczewski
*Assistant Examiner* — Toniae Thomas
(74) *Attorney, Agent, or Firm* — Patterson & Sheridan, LLP

(57) ABSTRACT

A switching circuit comprises a first transistor and a second transistor formed in an active area of semiconductor substrate. The source and drain regions of the transistors are electrically connected to respective source wires and drain wires through a plurality of intermediate metal layers stacked above the transistor. Electrical connections between different layers are made with a plurality of vias. To improve switching performance, the intermediate wires are disposed such that intermediate wires electrically connected to the transistor source regions are not directly beneath the drain wires. Similarly, intermediate wires electrically connected to drain regions are arranged not to be directly underneath source wires.

20 Claims, 9 Drawing Sheets

(56) References Cited

U.S. PATENT DOCUMENTS

2002/0149718 A1* 10/2002 Melnik et al. ............... 349/110
2002/0171098 A1* 11/2002 Nakaya et al. ............... 257/296
2003/0148558 A1* 8/2003 Kubo et al. .................. 438/128
2007/0187780 A1 8/2007 Tiemeijer

FOREIGN PATENT DOCUMENTS

| JP | 2008-251565 | 10/2008 |
| JP | 2009-171083 | 7/2009 |
| JP | 2010-103971 | 5/2010 |
| JP | 2010-147254 | 7/2010 |

* cited by examiner

SWITCHING CIRCUIT

CROSS-REFERENCE TO RELATED APPLICATION

This application is based upon and claims the benefit of priority from Japanese Patent Application No. 2012-120822, filed May 28, 2012, the entire contents of which are incorporated herein by reference.

FIELD

Embodiments described herein relate generally to a switching circuit.

BACKGROUND

The performance of a switching circuit can be determined by an on-state resistance and the capacitance between wirings, and the product of the on-state resistance and the capacitance between the wirings is an important performance index.

For example, in the case where the switching circuit is constituted by a MOSFET, the base values of the on-state resistance and the capacitance determine the MOSFET characteristics. But the influence of the on-state resistance and the capacitance of wiring connections in the on performance of the switching circuit is not negligible. In particular, since the wires in devices are formed closer to each other as fabrication processes advance and device miniaturization continues, the capacitance between the wires tends to increase.

DETAILED DESCRIPTION

Figure 1:
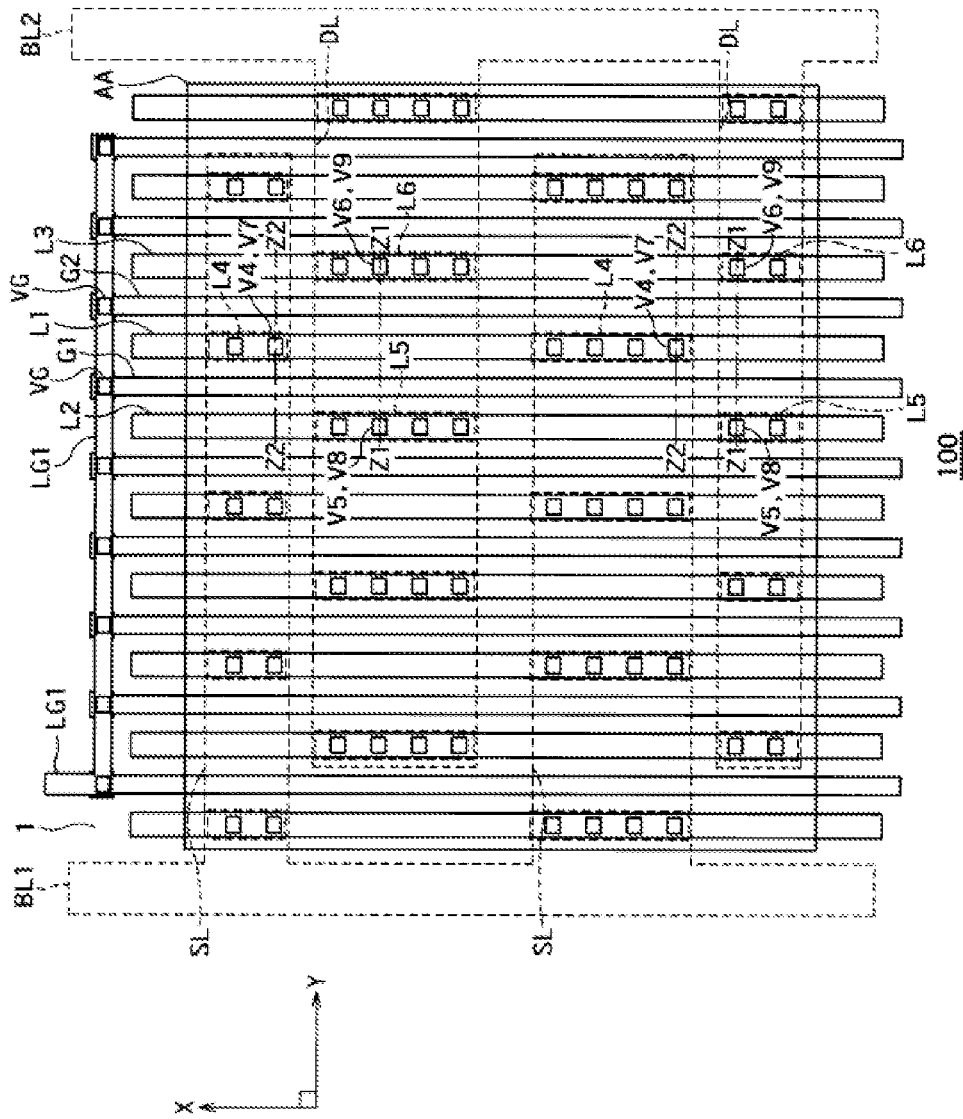
FIG. 1 is a plan view showing a layout example of a switching circuit according to a first embodiment.

A switching circuit that can further reduce the product of an on-state resistance and the capacitance between the wires is described herein. In general, embodiments will be explained with reference to the figures.

A switching circuit includes a semiconductor substrate with an active area, with a gate insulation layer disposed on active area, and a gate electrode layer disposed on the gate insulation layer. A transistor (first transistor) is formed in the active area, the transistor includes a gate formed in the gate electrode layer, a drain region (first drain region), a source region. Another transistor (second transistor) is also formed in the active area. This second transistor also includes a gate, a source region (which may be shared) and a drain region (second drain region). The source and drain regions of the transistors are connected to source lines and drain lines through several intermediate wiring layers (intermediate metal layers) which are stacked above the gate electrode layer. Electrical connections between various wiring layers (and the substrate) are made using metal vias (sometimes referred to as contacts). The source and drain lines share a common metal layer. These lines generally extend in the same direction (second direction), but are interleaved in alternating manner (e.g., source line-drain line-source line, etc.). Intermediate wires are arranged such that when a wire is electrically connected to the source region(s) of the transistors, the wire is not directly underneath any portion of a drain wire (that is, when viewed from above (or below) the intermediate wire would not overlap a drain wire). Similarly intermediate wires which are electrically connected to the transistor drain regions are arranged such that they are not directly underneath any source wire. This arrangement helps reduce inter-layer crosstalk. This switching circuit of an embodiment of the present disclosure is formed on a semiconductor substrate. The switching circuit includes a first gate electrode that is formed on a gate insulation layer disposed on the semiconductor substrate. The first gate electrode extends in a first direction. The switching circuit further includes a second gate electrode that is formed on the gate insulation layer disposed on the semiconductor substrate. The second gate electrode extends in the first direction. The switching circuit is provided with a first via wiring connected at one end to a source region adjacent to both the first gate electrode and the second gate electrode. The switching circuit is provided with a second via wiring that is connected at one end to a first drain region of the semiconductor substrate adjacent to the first gate electrode. The switching circuit is provided with a third via wiring that is connected at one end to a second drain region of the semiconductor substrate adjacent to the second gate electrode. A first wire of the switching circuit is formed in the first wiring layer. The first wire extends in the first direction and is connected to the other end of the first via wiring. A second wire of the switching circuit is also formed in the first wiring layer. The second wire extends in the first direction and is connected to the other end of the second via wiring. A third wire of the switching circuit is also formed in the first wiring layer. The third wire extends in the first direction and is connected to the other end of the third via wiring. The switching circuit is provided with a fourth via wiring that is connected at one end to the first wire. The switching circuit is provided with a fifth via wiring that is connected at one end to the second wire. The switching circuit is provided with a sixth via wiring that is connected at one end to the third wire. The fourth wire of the switching circuit is formed in a second wiring layer, extends in the first direction, and is connected to the other end of the fourth via wiring. A fifth wire is formed in the second wiring layer, extends in the first direction, and is connected to the other end of the fifth via wiring. A sixth wire is formed in the second wiring layer, extends in the first direction, and is connected to the other end of the sixth via wiring. The switching circuit is provided with a seventh via wiring connected to the fourth wiring. The switching circuit is provided with an eighth via wiring connected to the fifth wire. The switching circuit is provided with a ninth via wiring connected to the sixth wiring. A source wire of the switching circuit is formed in a third wiring layer, extends in the second direction, and is connected to the end of the seventh via wiring. A drain wire of the switching circuit is also formed in the third wiring layer, extends in the second direction adjacently to the source wiring, and is connected to the end of the eighth via wiring and the end of the ninth via wiring.

The fourth wire is not positioned in an area opposite to the drain wiring, and the fifth and sixth wires are not positioned in an area corresponding to the source wire.

(First Embodiment)

Figure 2:
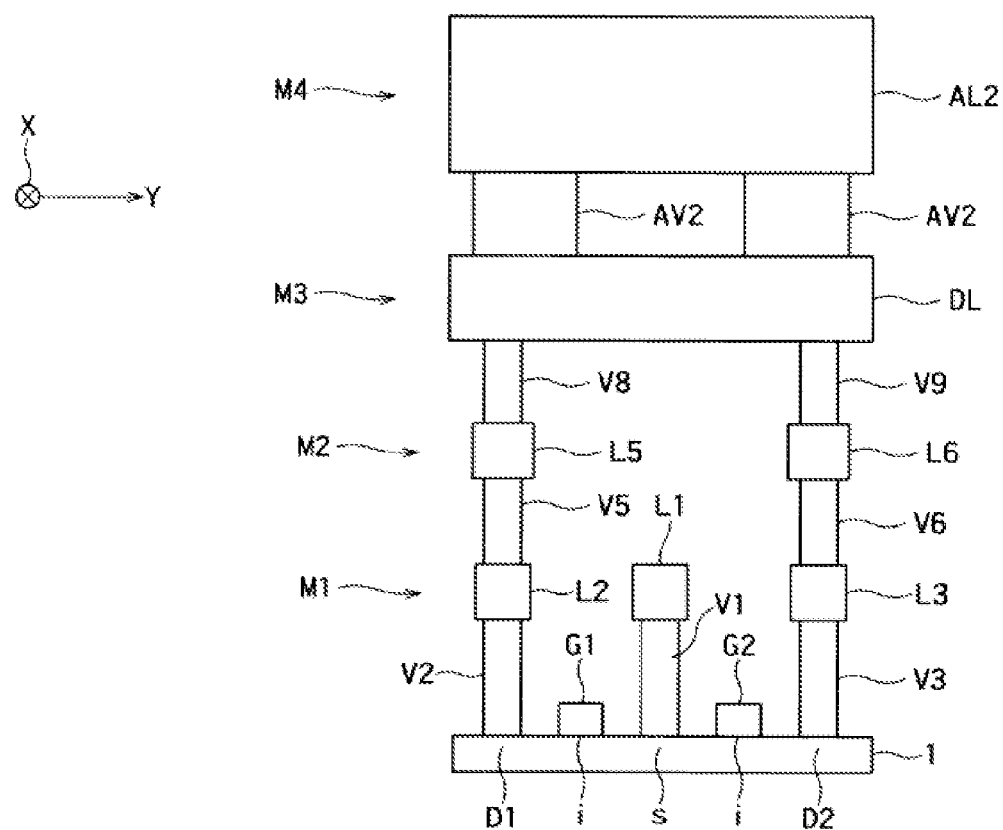
FIG. 2 is a cross section taken along the Z1-Z1 line in FIG. 1.
Figure 3:
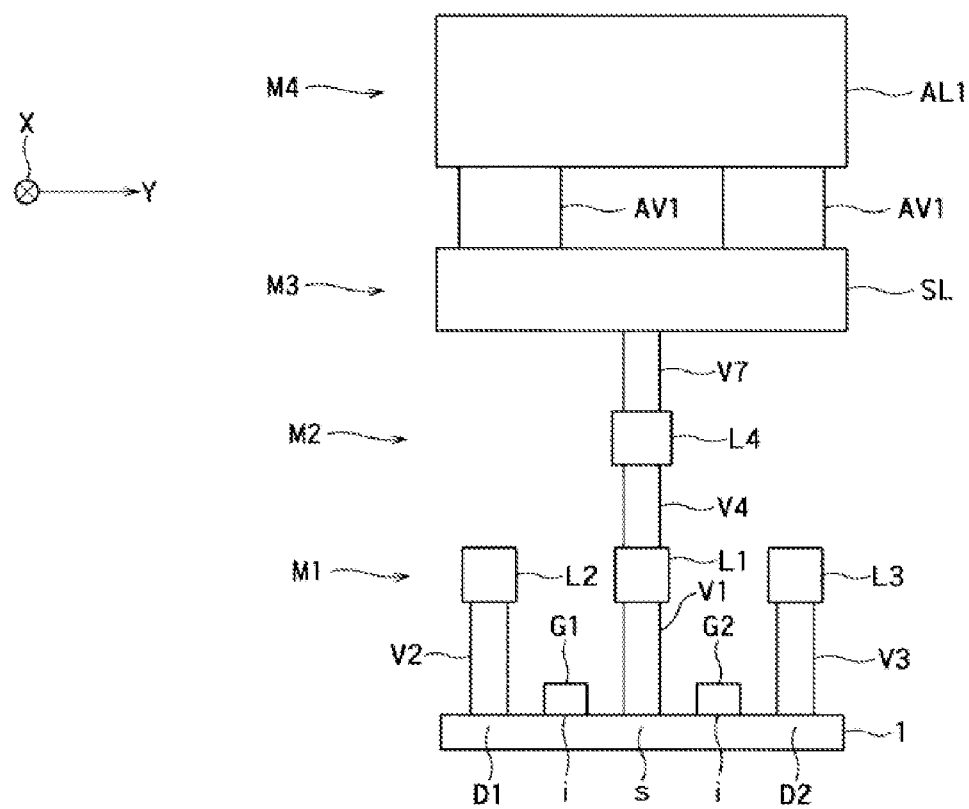
FIG. 3 is a cross section taken along Z2-Z2 line in FIG. 1.

FIG. 1 is a plan view showing a layout example of a switching circuit 100 according to the first embodiment. FIG. 2 is a cross section taken along the Z1-Z1 line in FIG. 1. FIG. 3 is a cross section taken along the Z2-Z2 line in FIG. 1.

Here, a source region S, first and second drain regions D1 and D2, gate insulation layer i, first to third via wirings V1 to V3, first and second additional wires AL1 and AL2, and tenth and eleventh via wirings AV1 and AV2 shown in FIG. 2 and FIG. 3 are not shown in FIG. 1.

As shown in FIG. 1 through FIG. 3, the switching circuit 100 is constructed with a semiconductor substrate 1, a gate insulation layer i, a first gate electrode G1, a second gate electrode G2, a first wire L1, a second wire L2, a third wire L3, a fourth wire L4, a fifth wire L5, a sixth wire L6, a seventh wire L7, an eighth wire L8, a ninth wire L9, a first via wiring V1, a second via wiring V2, a third via wiring V3, a fourth via wiring V4, a fifth via wiring V5, a sixth via wiring V6, a seventh via wiring V7, an eighth via wiring V8, a ninth via wiring V9, a source wire SL, a drain wire DL, a tenth via wiring AV1, an eleventh via wiring AV2, first additional wires AL1, second additional wires AL2, a first bus BL1, and a second bus BL2.

Here, for example, an interlayer dielectric (not shown in the figure) is filled between the respective elements of the switching circuit 100.

The semiconductor substrate 1 is an SOI (silicon on insulator) substrate. An active area AA, where the source region S and the first and second drain regions D1 and D2 are formed, is created on the semiconductor substrate 1. The active area AA is divided in a first direction X and a second direction Y by an element isolation insulating film not shown in the figure. Here, the first direction X and the second direction Y are approximately orthogonal to each other.

The first gate electrode G1 is formed via the gate insulation layer i on the semiconductor substrate 1 and extends in the first direction X.

The second gate electrode G2 is formed via the gate insulation layer i on the semiconductor substrate 1 and extends in the first direction X.

The first gate electrode G1 is connected to a gate wiring LG1 by a via wiring VG. In addition, the second gate electrode G2 is connected to a gate wire LG2 by the via wiring VG. In other words, the first gate electrode G1 and the second gate electrode G2 are electrically connected.

Moreover, lower part (one end) of the first via wiring V1 is connected to the source region S of the semiconductor substrate 1 adjacent to the first gate electrode G1 and the second gate electrode G2 in the second direction Y.

The lower part (one end) of the second via wiring V2, is connected to the first drain region D1 of the semiconductor substrate 1 adjacent to the side opposite to the source region S with respect to the first gate electrode G1 in the second direction Y.

The lower part (one end) of the third via wiring V3 is connected to the second drain region D2 of the semiconductor substrate 1 adjacent to the side opposite to the source region S with respect to the second gate electrode G2 in the second direction Y.

Here, the semiconductor substrate 1, source region S, first drain region D1, gate insulation layer i, and first gate electrode G1 form a MOSFET.

Similarly, the semiconductor substrate 1, source region S, second drain region D2, gate insulation layer i, and second gate electrode G2 form a MOSFET.

Therefore, the first direction X corresponds to a channel width direction of the MOSFET, and the second direction Y corresponds to a channel length direction of the MOSFET.

In addition, the first wire L1 is formed in a first wire layer M1 above the semiconductor substrate 1 and extends in the first direction X, and its lower surface is connected to the upper part (the other end) of the first via wiring V1.

The second wire L2 is formed in the first wire layer M1, and its lower surface is connected to the upper part (the other end) of the second via wiring V2 and extends in the first direction X.

The third wire L3 is formed in the first wiring layer M1, and its lower surface is connected to the upper part (the other end) of the third via wiring V3 and extends in the first direction X.

Moreover, in the fourth via wiring V4, its lower part (one end) is connected to the upper surface of the first wire L1.

In the fifth via wiring V5, its lower part (one end) is connected to the upper surface of the second wire L2.

In the sixth via wiring V6, its lower part (one end) is connected to the upper surface of the third wire L3.

Furthermore, the fourth wire L4 is formed in a second wiring layer M2 above the first wire layer M1 and extends in the first direction X, and its lower surface is connected to the upper part (the other end) of the fourth via wiring V4.

The fifth wire L5 is formed in the second wiring layer M2 and extends in the first direction X, and its lower surface is connected to the upper part (the other end) of the fifth via wiring V5.

The sixth wire L6 is formed in the second wiring layer M2 and extends in the first direction X, and its lower surface is connected to the upper part (the other end) of the sixth via wiring V6.

Here, the first to sixth wires L1 to L6, for example, are metal wirings.

In addition, in the seventh via wiring V7, its lower part (one end) is connected to the upper surface of the fourth wire L4.

In the eighth via wiring V8, its lower part (one end) is connected to the upper surface of the fifth wire L5.

In the ninth via wiring V9, its lower part (one end) is connected to the upper surface of the sixth wire L6.

Moreover, the source wire SL is formed in a third wire layer M3 above the second wiring layer M2 and extends in the second direction Y; its lower surface is connected to the upper part (the other end) of the seventh via wiring V7 (FIG. 1 and FIG. 3).

The drain wire DL is formed in the third wiring layer M3, extends in the second direction Y adjacently to the source wire SL; its lower surface is connected to the upper part (the other end) of the eighth via wiring V8, and the upper part (the opposite end) is connected to the ninth via wiring V9 (FIG. 1 and FIG. 2).

Here, the source wire SL and the drain wire DL, for example, are metal wires.

Furthermore, as shown in FIG. 1, for the adjacent source wire SL and drain wire DL in the vicinity of the center of the active area AA, a width in the first direction X of the source wire SL and a width in the first direction X of the drain wire DL are equal.

In addition, as shown in FIG. 1, in case the source wiring SL is adjacent to the end of the active area AA, where the source region S and the first and second drain regions D1 and D2 of the semiconductor substrate 1 are formed (the case of the combination of the upper source wire SL and drain wire DL of FIG. 1), the width in the first direction X of the source wire SL is a half of the width in the first direction X of the drain region DL.

Similarly, in case the drain wire DL is adjacent to the end of the active area AA, where the source region S and the first and second drain regions D1 and D2 of the semiconductor substrate 1 are formed (the case of the combination of the lower source wire SL and drain wire DL of FIG. 1), the width in the first direction X of the drain wire DL is a half of the width in the first direction X of the source region SL.

With the width of the source wire SL and the drain wire DL constructed in this manner, the MOSFET connected to the source wire SL and drain wire DL are balanced/uniform. In other words, the characteristics of each MOSFET are equal.

Therefore, since current flows uniformly to each first gate electrode G1, the on-state resistance of the MOS transistor can be reduced. In other words, the switching performance of the switching circuit 100 can be improved.

In addition, since the density of the current flowing in each wiring layer is made to be uniform, the current and power, which can be input into the switching circuit 100, can be further increased.

Moreover, the fourth wire L4 is not positioned in an area (an area opposite to the drain wire DL) below the drain wire DL (FIG. 1 and FIG. 2).

In particular, the fourth wire L4, as shown in FIG. 1 and FIG. 3, is positioned only in an area opposite to and below the source wire SL (an area opposite to the source wire SL).

The length in the first direction X of the fourth wire L4, as shown in FIG. 1, is equal to the width in the first direction X of the source wire SL.

Furthermore, the fifth and six wires L5 and L6 are not positioned in an area below the source wire SL (an area opposite to the source wire SL) (FIG. 1 and FIG. 3).

In particular, the fifth and six wires L5 and L6, as shown in FIG. 1 and FIG. 2, are positioned only in an area below the drain wire DL (an area opposite to the drain wire DL).

The length in the first direction X of the fifth and sixth wires L5 and L6, as shown in FIG. 1, is equal to the width in the first direction X of the drain wire DL.

In addition, the first bus BL1 is formed in the third wiring layer M3, extends in the first direction X, and is connected to one end of the source wire SL.

The second bus BL2 is formed in the third wiring layer M3 so that the source wire SL and the drain wire DL are positioned between this bus and the first bus BL2. The second bus BL2 extends in the first direction X and is connected to one end of the drain wire DL.

Here, the first and second buses BL1 and BL2 are metal wires, for example.

As shown in FIG. 3, in the tenth via wiring AV1, for example, its lower part (one end) is connected to the upper surface of the source wire SL.

As shown in FIG. 2, the lower part (one end) of the eleventh via wiring AV2 is connected to the upper surface of the drain wire DL.

In addition, as shown in FIG. 3, the first additional wire AL1 is formed in the fourth wiring layer M4 above the third wiring layer M3, and its lower surface is connected to the upper part (the other end) of the tenth via wiring AV1.

The first additional wire AL1 has the same planar shape as that of the source wire SL.

Moreover, as shown in FIG. 2, the second additional wire AL2 is formed in a fourth wiring layer M4 and extends adjacently to the first additional wire AL1 in the second direction Y; its lower surface is connected to the eleventh via wiring AV2.

Here, the first and second additional wires AL1 and AL2 are metal wires, for example.

The on-state resistance of the switching circuit 100 can be lowered by these first and second additional wires AL1 and AL2.

The second additional wire AL2 has the same planar shape as that of the drain wire DL.

In particular, as shown in FIG. 1, several pieces (two pieces in the example of FIG. 1) of units, including the first to ninth via wirings V1 to V9, fourth to sixth wires L4 to L6, source wire SL, and drain wire DL, are arranged in parallel in the first direction X.

Therefore, the current load, which is applied to the first wire layer M1, can be reduced.

As previously mentioned, it is unnecessary for the fourth to sixth wires L4 to L6 of the second wiring layer M2 to have a comb-shaped structure, and these wires are arranged only in necessary areas.

In other words, since the wiring spacing of the second wiring layer M2 increases, the capacitance between the wires is significantly reduced. In addition, the on-state resistance can also be reduced by adjusting the width of the wiring of the third wiring layer M3.

As previously mentioned, according to the switching circuit of this embodiment, the product of the on-state resistance and the capacitance between the wirings can be further decreased.

(Second Embodiment)

In the first embodiment, an example of the constitution in which the source wire (drain wire) and the first additional wire (second additional wire) are parallel has been explained.

In the second embodiment, an example of the constitution in which the source wire (drain wire) and the first additional wire (second additional wire) are orthogonal to each other will be explained.

Figure 4:
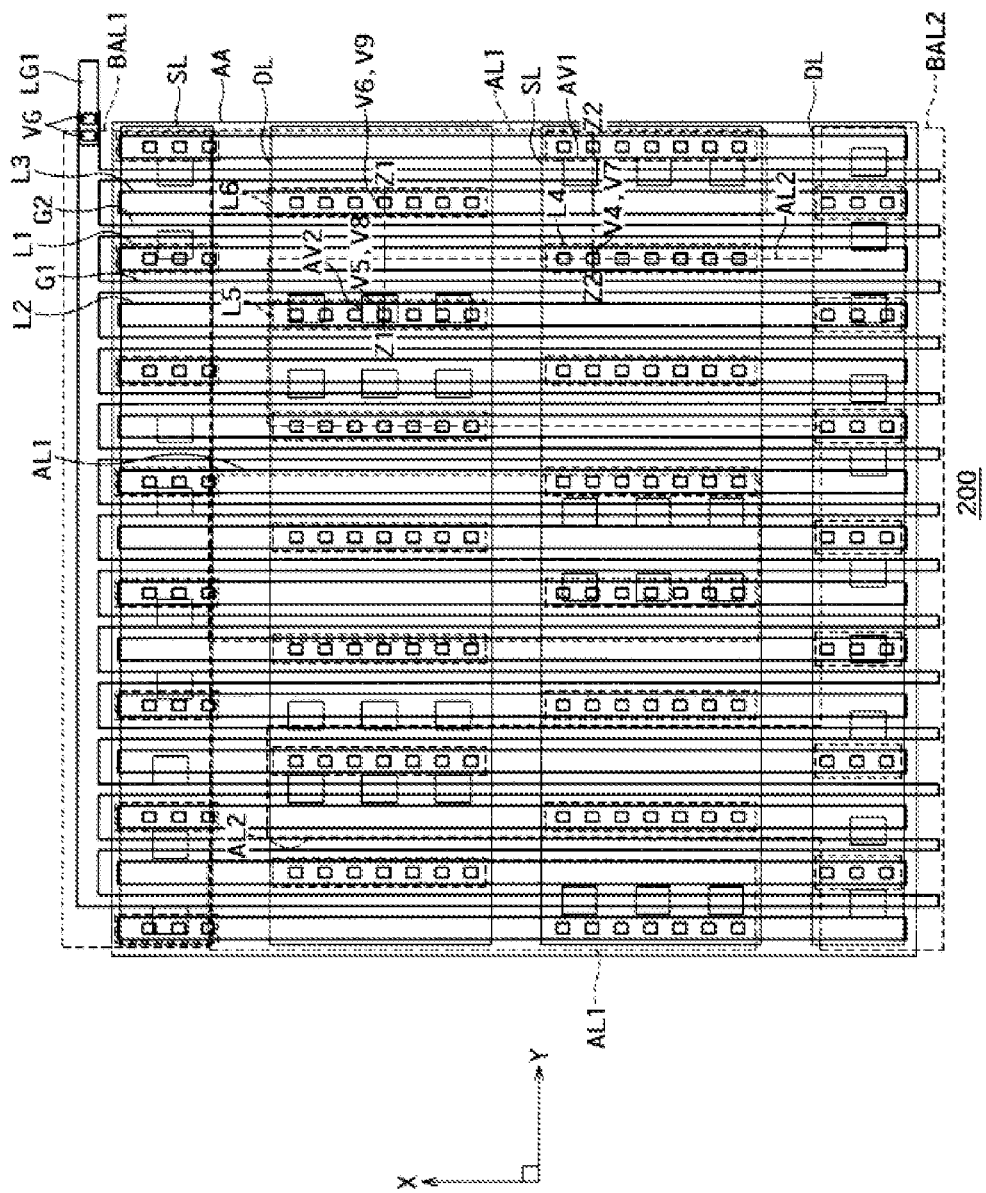
FIG. 4 is a plan view showing a layout example of a switching circuit according to a second embodiment.
Figure 5:
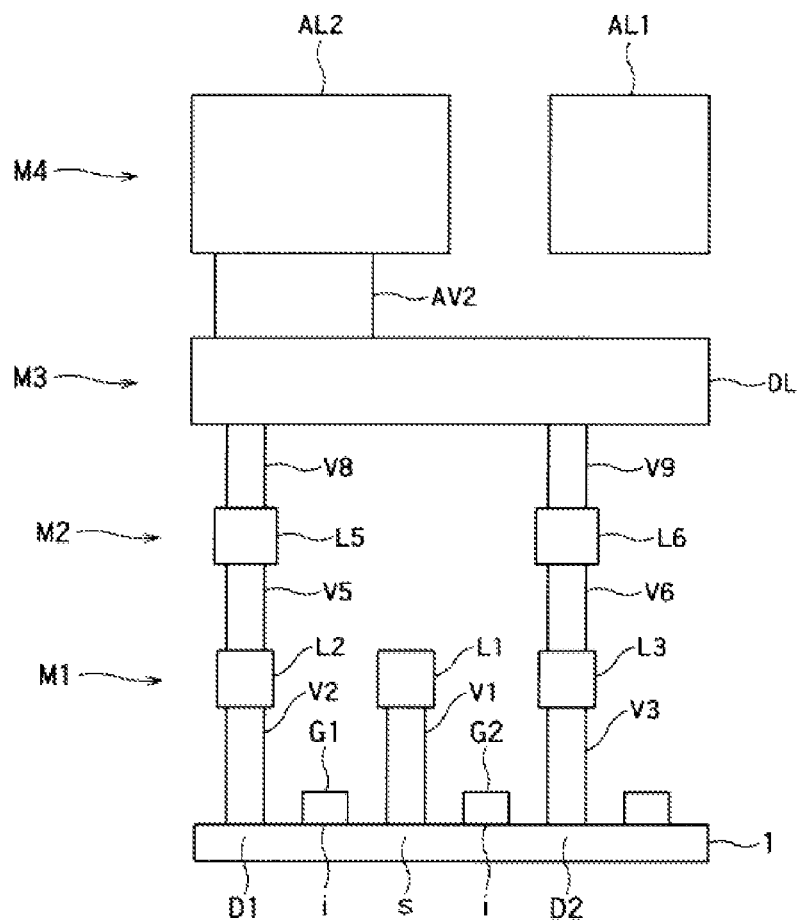
FIG. 5 is a cross section taken along Z1-Z1 line in FIG. 4.
Figure 6:
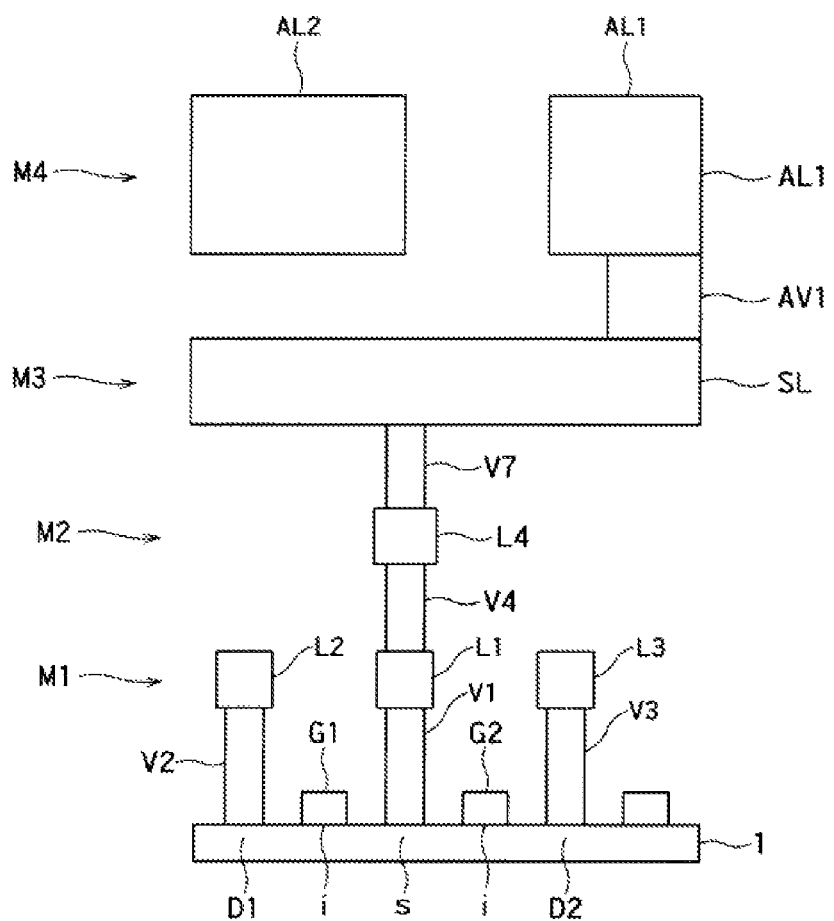
FIG. 6 is a cross section taken along Z2-Z2 line in FIG. 4.

FIG. 4 is a plan view showing an example of the layout constitution of a switching circuit 200 of the second embodiment. FIG. 5 is a cross section showing an example of the cross section along Z1-Z1 line in a second direction Y of FIG. 4. FIG. 6 is a cross section showing an example of the cross section along Z2-Z2 line in the second direction Y of FIG. 4.

Here, in FIG. 4 through FIG. 6, the same symbols as those used in FIG. 1 through FIG. 3 represent constitutions similar to those of the first embodiment. In addition, for simplicity, the source region S, first and second drain regions D1 and D2, gate insulation layer i, and first to third via wirings V1 to V3 shown in FIG. 5 and FIG. 6 are not shown in FIG. 4.

As shown in FIG. 4 through FIG. 6, the switching circuit 200 is constructed with a first additional bus BAL1 and a second additional bus BAL2, as opposed to the switching circuit 100 of the first embodiment.

The first additional bus BAL1 is formed in the fourth wiring layer M4 and extends in the second direction Y. In addition, the first additional wire AL1 is connected to the first additional bus BAL1.

The second additional bus BAL2 is formed in the fourth wiring layer M4 and extends in the second direction Y. In addition, the second additional wire AL2 is connected to the second additional bus BAL2.

In this switching circuit 200, the respective first and second additional wires AL1 and AL2 extend in the first direction X.

In other words, the fourth wiring layer M4 has a comb-shaped constitution. In addition, the source wire SL (drain wire DL) and the first additional wire AL1 (second additional wire AL2) are orthogonal to each other.

In this embodiment, if a multilayer wiring process is adopted, the wires are stacked upward in a state in which the gap between the appropriate comb-shaped wires can be increased, thus being able to minimize the product of the on-state resistance and the capacitance between the wires.

The other constitutions and functions of the switching circuit 200 are similar to those of the switching circuit 100 of the first embodiment.

In other words, according to the switching circuit of this embodiment, similarly to the first embodiment, the product of the on-state resistance and the capacitance between the wirings can be further decreased.

(Third Embodiment)

In the third embodiment, an example of the constitution in which a MOSFET has a double-gate structure will be explained.

Figure 7:
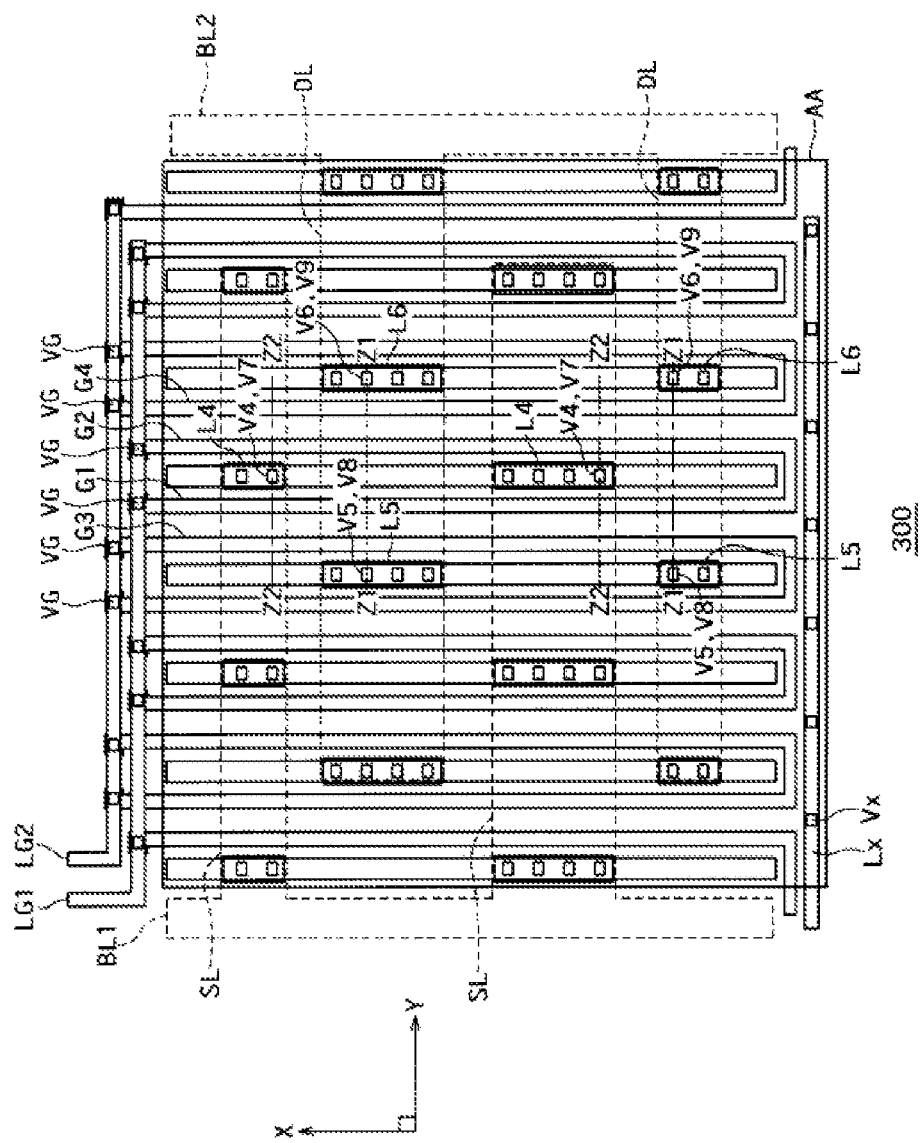
FIG. 7 is a plan view showing a layout example of a switching circuit according to a third embodiment.
Figure 8:
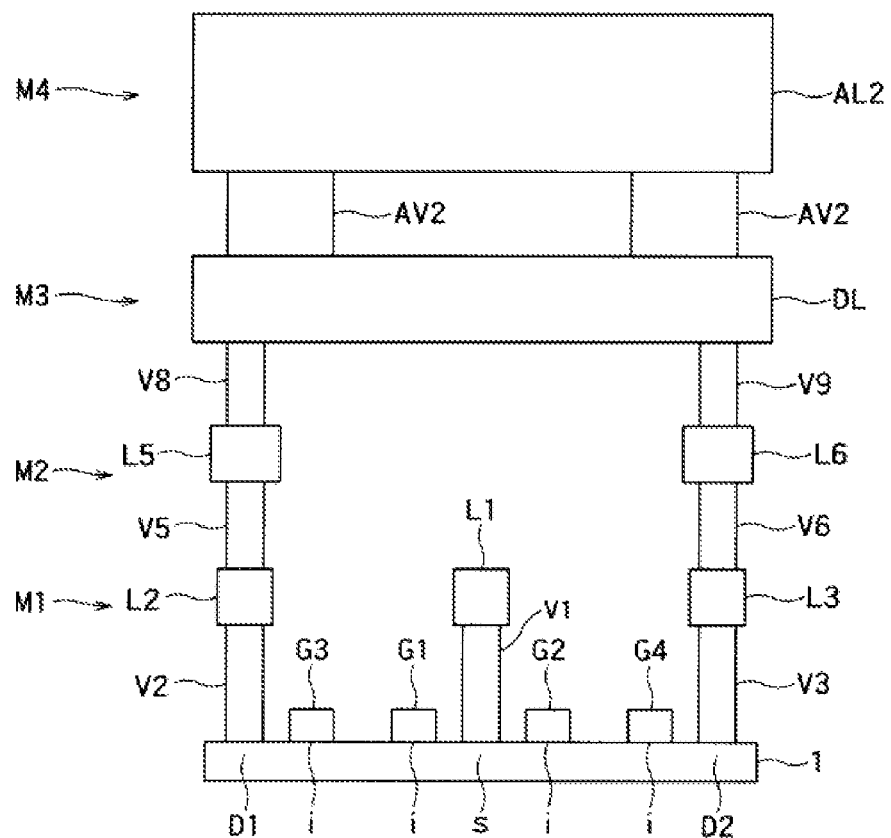
FIG. 8 is a cross section taken along Z1-Z1 line FIG. 7.
Figure 9:
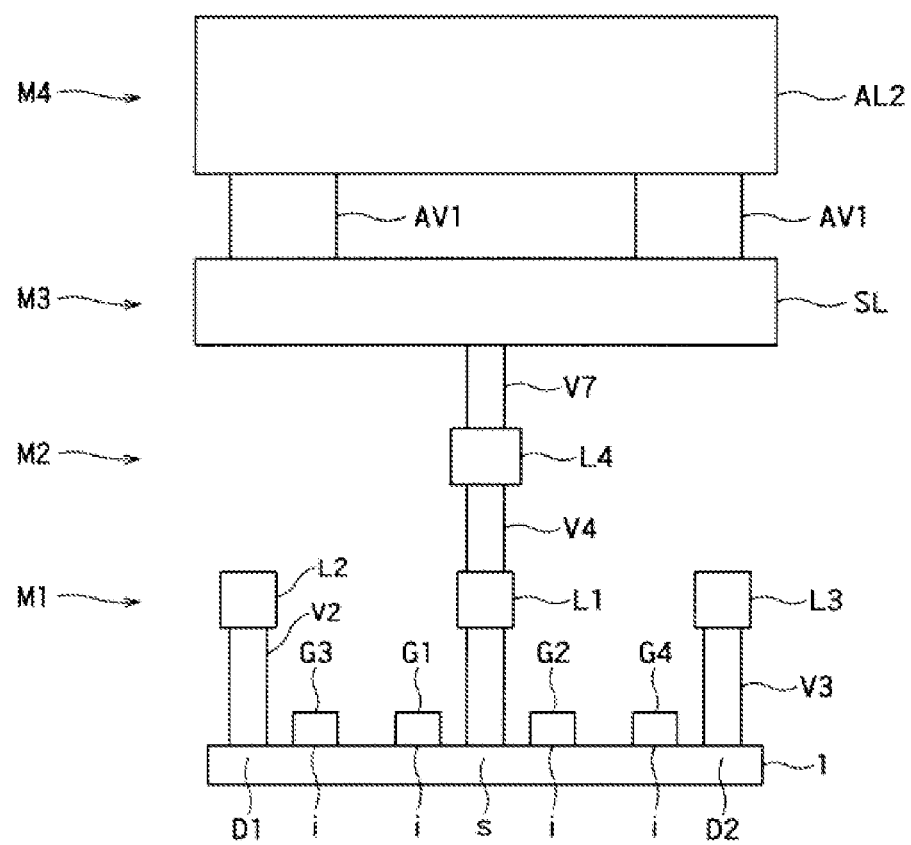
FIG. 9 is a cross section taken along Z2-Z2 line in FIG. 7.

FIG. 7 is a plan view showing an example of the layout constitution of a switching circuit 300 of the third embodiment. FIG. 8 is a cross section showing an example of the cross section along Z1-Z1 line in a second direction Y of FIG. 7. FIG. 9 is a cross section showing an example of the cross section along Z2-Z2 line in the second direction Y of FIG. 7.

Here, in FIG. 7 through FIG. 9, the same symbols as those used in FIG. 1 through FIG. 3 represent constitutions similar to those of the first embodiment. In addition, for simplicity, the source region S, first and second drain regions D1 and D2, gate insulation layer i, first to third via wirings V1-V3, first and second additional wires AL1 and AL2, and tenth and eleventh via wirings AV1 and AV2 shown in FIG. 8 and FIG. 9 are not shown in FIG. 7.

As shown in FIG. 7 through FIG. 9, the switching circuit 300 is constructed with a third gate electrode G3, fourth gate electrode G4, gate wiring LG2, wiring Lx, and via wiring Vx, in contrast to the switching circuit 100 of the first embodiment.

The third gate electrode G3 is formed via the gate insulation layer i on the semiconductor substrate 1, extends in the first direction X, and is adjacent to the first gate electrode G1 between the source region S and the first drain region D1 in the second direction Y.

The fourth gate electrode G4 is formed on the gate insulation layer i disposed on the semiconductor substrate 1, extends in the first direction X, and extends in the first direction X adjacent to the second gate electrode G2 between the source region S and the second drain region D2 in the second direction Y.

Here, the third gate electrode G3 is connected to the gate wire LG2 by the via wiring VG. In addition, the fourth gate electrode G4 is connected to the gate wire LG2 by the via wiring VG. In other words, the third gate electrode G3 and the fourth gate electrode G4 are electrically connected.

Therefore, even with the switch 300 having a double gate structure, the capacitance between the wires can be reduced by multiplexing similar to that of the first embodiment.

Here, in case the semiconductor substrate 1 is an SOI substrate, as shown in FIG. 7, the wiring Lx is electrically connected to the active area AA of the semiconductor substrate 1 by the via wiring Vx. A prescribed voltage is applied to the wiring Lx, or a voltage is output to the wiring.

The other constitutions and functions of the switching circuit 300 are similar to those of the switching circuit 1 of the first embodiment.

In other words, according to the switching circuit of this embodiment, similarly to the first embodiment, the product of the on-state resistance and the capacitance between the wires can be further decreased.

Here, the embodiments are illustrations, and the scope of the present disclosure is not limited to them.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching circuit, comprising:
 a semiconductor substrate having an active area;
 a gate insulation layer disposed on the active area;
 a gate electrode layer disposed on the gate insulation layer;
 first and second transistors each having a different gate formed in the gate electrode layer, a different drain region formed in the semiconductor substrate, and a shared source region formed in the semiconductor substrate;
 a plurality of intermediate wiring layers stacked above the gate electrode layer;
 a first via wiring layer making electrical connections between regions in the semiconductor substrate and a first wiring layer that is the intermediate wiring layer closest to the semiconductor substrate;
 a plurality of intermediate vias each disposed between the intermediate wiring layers to form electrical connections between the intermediate wiring layers;
 a plurality of source wires arrayed in a first direction and extending in a second direction that is substantially orthogonal to the first direction, and electrically connected to the shared source region of the first and second transistors;
 a plurality of drain wires arrayed in the first direction and extending in the second direction, and electrically connected to the drain regions of the first and second transistors,
 wherein the first wiring layer is directly underneath the drain wires with no intermediate wiring layers interposed between the first wiring layer and the drain wires and the first wiring layer is directly underneath the source wires with no intermediate wiring layers interposed between the first wiring layer and the source wires.

2. The device of claim 1, wherein the drains wires and the source wires are alternately arranged.

3. The device of claim 1, wherein a width of a source wire located at a first end of the active area is less than half a width of a drain wire adjacent to said source wire, and a width of a drain wire located at a second end of the active area is less than half a width of a source wire adjacent to said drain wire.

4. The device of claim 1, further comprising:
 an additional metal layer above the source and drain wires, the additional metal layer comprising a first plurality of additional wires electrically connected to the source wires and a second plurality of additional wires electrically connected to the drain wires.

5. The device of claim 4, wherein the first and second plurality of additional wires extend in the first direction.

6. A switching circuit, comprising:
 a semiconductor substrate;
 first and second gate electrodes formed on a gate insulation layer on the semiconductor substrate and extends in a first direction;
 a first via wiring that is connected at one end to a source region that is adjacent to the first gate electrode and the second gate electrode;

a second via wiring that is connected at one end to a first drain region adjacent to a side opposite to the source region with respect to the first gate electrode;
a third via wiring that is connected at one end to a second drain region adjacent to a side opposite to the source region with respect to the second gate electrode;
a first wire that is formed in a first wiring layer, is connected to the other end of the first via wiring, and extends in the first direction;
a second wire that is formed in the first wiring layer, is connected to the other end of the second via wiring, and extends in the first direction;
a third wire that is formed in the first wiring layer, is connected to the other end of the third via wiring, and extends in the first direction;
a fourth via wiring that is connected at one end to the first wire;
a fifth via wiring that is connected at one end to the second wire;
a sixth via wiring that is connected at one end to the third wire;
a fourth wire that is formed in a second wiring layer, extends in the first direction, and is connected to the other end of the fourth via wiring;
a fifth wire that is formed in the second wiring layer, extends in the first direction, and is connected to the other end of the fifth via wiring;
a sixth wire that is formed in the second wiring layer, extends in the first direction, and is connected to the other end of the sixth via wiring;
a seventh via wiring that is connected at one end to the fourth wire;
an eighth via wiring that is connected at one end to the fifth wire;
a ninth via wiring that is connected at one end to the sixth wire;
a source wire that is formed in a third wiring layer, extends in a second direction, and is connected to the other end of the seventh via wiring; and
a drain wire that is formed in the third wiring layer, extends in the second direction, and is connected to the other end of the eighth via wiring and the other end of the ninth via wiring;
wherein the fourth wire is not positioned in an area beneath the drain wire, and the fifth and sixth wires are not positioned in an area beneath the source wire, and the first direction and the second direction are approximately orthogonal to each other.

7. The switching circuit according to claim 6, wherein the fourth wire is positioned only in an area beneath the source wire, and the fifth and sixth wires are positioned only in an area beneath the drain wire.

8. The switching circuit according to claim 7, wherein a length of the fourth wire in the first direction is equal to a width of the source wire in the first direction, and a length of the fifth wire in the first direction and a length of the sixth wire in the first direction are equal to a width of the drain wire in the first direction.

9. The switching circuit according to claim 8, wherein the first to sixth wires, the source wire, and the drain wire are metal wires.

10. The switching circuit according to claim 6, wherein a width of the source wire in the first direction is equal to a width of the drain wire in the first direction.

11. The switching circuit according to claim 6, wherein the first gate electrode and the second gate electrode are electrically connected.

12. The switching circuit according to claim 6, further comprising:
a tenth via wiring that is connected at one end to the source wiring;
an eleventh via wiring that is connected at one end to the drain wire;
a first additional wire that is formed in a fourth wiring layer, extends in the second direction, and is connected to the other end of the tenth via wiring; and
a second additional wire that is formed in the fourth wiring layer, extends in the second direction, and is connected to the eleventh via wiring.

13. The switching circuit according to claim 12, wherein the first additional wire has the same width and length as the source wire and is positioned directly above the source wire, and the second additional wire has the same width and length as the drain wire and is positioned directly above the drain wire.

14. The switching circuit according to claim 6, further comprising:
a third gate electrode that is formed on a gate insulation layer on the semiconductor substrate, extends in the first direction, and is adjacent to the first gate electrode between the source region and the first drain region; and
a fourth gate electrode that is formed via a gate insulation layer on the semiconductor substrate, extends in the first direction, and is adjacent to the second gate electrode between the source region and the second drain region.

15. The switching circuit according to claim 14, wherein the third gate electrode and the fourth gate electrode are electrically connected.

16. The switching circuit according to claim 6, further comprising:
a first bus that is formed in the third wiring layer, extends in the first direction, and is connected to the source wire; and
a second bus that is formed in the third wiring layer such that the source wire and the drain wire are between the first bus and the second bus, extends in the first direction, and is connected to the drain wire.

17. The switching circuit according to claim 6, wherein the source wire is adjacent to an end of an active area, in which the source region and the first and second drain regions are formed, and has a width in the first direction that is a half of a width of the drain wire in the first direction.

18. The switching circuit according to claim 6, wherein the drain wire is adjacent to an end of an active area, in which the source region and the first and second drain regions are formed, and has a width in the first direction that is a half of a width of the source wire in the first direction.

19. The switching circuit according to claim 6, wherein the semiconductor substrate is a silicon on insulator (SOI) substrate.

20. A switching circuit, comprising:
a semiconductor substrate having an active area;
a gate insulation layer disposed on the active area;
a gate electrode layer disposed on the gate insulation layer;
first and second transistors each having a different gate formed in the gate electrode layer, a different drain region formed in the semiconductor substrate, and a shared source region formed in the semiconductor substrate;
a plurality of intermediate wiring layers stacked above the gate electrode layer;
a first via wiring layer making electrical connections between regions in the semiconductor substrate and a first wiring layer that is the intermediate wiring layer closest to the semiconductor substrate;

a plurality of intermediate vias each disposed between the intermediate wiring layers to form electrical connections between the intermediate wiring layers;

a plurality of source wires arrayed in a first direction and extending in a second direction that is in a same plane as the first direction but is not parallel to the first direction, and electrically connected to the shared source region of the first and second transistors;

a plurality of drain wires arrayed in the first direction and extending in the second direction, and electrically connected to the drain regions of the first and second transistors, wherein the first wiring layer is directly underneath the drain wires with no intermediate wiring layers interposed between the first wiring layer and the drain wires and the first wiring layer is directly underneath the source wires with no intermediate wiring layers interposed between the first wiring layer and the source wires.

* * * * *